United States Patent
Cheng et al.

(10) Patent No.: US 9,218,965 B2
(45) Date of Patent: Dec. 22, 2015

(54) GAN EPITAXIAL GROWTH METHOD

(71) Applicant: National Tsing Hua University, Hsinchu (TW)

(72) Inventors: Keh-Yung Cheng, Hsinchu (TW); Yu-Li Wang, Hsinchu (TW); Wei-Chen Yang, Hsinchu (TW); Shao-Yen Chiu, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 130 days.

(21) Appl. No.: 14/229,285

(22) Filed: Mar. 28, 2014

(65) Prior Publication Data

US 2015/0279656 A1   Oct. 1, 2015

(51) Int. Cl.
  *H01L 21/00*   (2006.01)
  *H01L 21/02*   (2006.01)
  *H01L 21/306*  (2006.01)
  *H01L 21/3065* (2006.01)

(52) U.S. Cl.
  CPC ........ *H01L 21/0254* (2013.01); *H01L 21/0262* (2013.01); *H01L 21/3065* (2013.01); *H01L 21/30604* (2013.01)

(58) Field of Classification Search
  CPC ............ H01L 21/0254; H01L 21/0262; H01L 21/30604; H01L 21/3065
  USPC ........................ 438/34, 35, 36, 39, 41, 46, 47
  See application file for complete search history.

(56) References Cited

U.S. PATENT DOCUMENTS

| | | | | |
|---|---|---|---|---|
| 8,294,025 B2* | 10/2012 | Fonash | .................. | B82Y 20/00 136/252 |
| 9,048,347 B2* | 6/2015 | Wei | ....................... | H01L 33/007 |
| 2009/0098343 A1* | 4/2009 | Arena | ............... | H01L 21/02645 428/172 |
| 2011/0037050 A1* | 2/2011 | Kim | ...................... | H01L 33/465 257/13 |
| 2014/0299968 A1* | 10/2014 | Wang | ................. | H01L 21/0237 257/618 |

* cited by examiner

*Primary Examiner* — Kevin M Picardat
(74) *Attorney, Agent, or Firm* — Muncy, Geissler, Olds & Lowe, P.C.

(57) ABSTRACT

By using a nano-scale patterning process, a dislocation defect density of a GaN epitaxy layer can be further reduced. This is because the nano-scale epitaxy structure dimension is advantageous to the reduction of the strain energy accumulated by mismatched lattices, thereby decreasing the possibility of generating defects. It is verified that the nano-scale patterning process can effectively decrease the dislocation defect density of the GaN epitaxial layer on a sapphire substrate. Considering uniformity and reproducibility on the application of the large-size wafer, the invention has utilized the soft mask NIL patterning technology to successfully implement the uniform deposition and position control of the InAs quantum dot on a GaAs substrate. This further utilizes the NIL technology in conjunction with dry-etching to perform the nano-scale patterning on a heterogeneous substrate, such as Si, sapphire or the like.

10 Claims, 3 Drawing Sheets

GAN EPITAXIAL GROWTH METHOD

BACKGROUND OF THE INVENTION

1. Field of the Invention

The invention relates to a gallium nitride (GaN) epitaxial growth method, and more particularly to a gallium nitride epitaxial growth method of a flexible nano-imprint.

2. Related Art

Performing structure epitaxy and process of a power device on a GaN epitaxy substrate, which is homogeneous and has the matched property, is advantageous to the creating of the device indicator property. Using the heterogeneous substrate (e.g., Sapphire, Si, or the like) is advantageous to the reduction of the research, development and manufacturing costs. However, due to the influence of the property mismatch, the "low-defect" heterogeneous epitaxy technology has to be further researched and developed. The lattice constant and thermal expansion coefficient differences, induced by the heterogeneous epitaxy, inevitably affect the epitaxy structure quality, thereby causing the defects and stresses of the epitaxial layer. In the device application, the pressure resistance of the device is seriously affected, and the epitaxial layer stress causes the wafer warpage and affects the device processing precision. In the large-scale wafer, especially the MOCVD epitaxy technology of growth at the high temperature, this phenomenon becomes more serious. Taking the Si substrate as an example, the lattice mismatch between Si and GaN is as high as 16.2%, the difference between the thermal expansion coefficients of Si and GaN is as high as 113%, and the disadvantageous factor, such as the high reaction activity between Si and nitrogen (N) atoms. Thus, the MBE epitaxy technology adopting the low-temperature growth is a key issue for implementing the low-defect heterogeneous epitaxy technology. If the vertical device is to be implemented, then the pressure resistance is extremely associated with the thickness (more than 4 microns) and the quality of the GaN epitaxial layer.

The epitaxy technology, either the molecule beam epitaxy (MBE) or the metal organic chemical vapor deposition (MOCVD), has implemented the epitaxy growth of hexagonal structure gallium nitride (GaN) on the Si (111) substrate. In the example reference [C. W. Nieh, Y. J. Lee, W. C. Lee, Z. K. Yang, A. R. Kortan, M. Hong, J. Kwo, and C. H. Hsu, Appl. Phys. Lett., 92, 061914 (2008)], a well-crystallized monocrystalline oxide layer with several nanometers is firstly deposited on the Si (111), and serves as the epitaxy pattern bottom of the monocrystalline GaN, wherein this pattern bottom can effective prevent the mutual diffusion between Si and GaN and is also a key seeding layer for the growth of GaN. Considering the mainstream silicon wafer technology and the potential of the future integrated III-N and silicon device, Si (001) is the more pragmatic and preferred choice. In addition, compared with the current generic hexagonal wurtzite structure, the III-N of the cubic zinc-blende structure has the advantages of the non-polarization, the high quantum efficiency and the high p-type conductivity. However, growing GaN on Si (001) makes the growth of GaN have multiple preferred orientations due to the plane symmetry difference, thereby causing the polycrystalline structure or coarse surface. In addition, the above-mentioned thermal expansion coefficient difference and lattice mismatch also cause the epitaxial layer to have the high threading dislocation (TD) density or even to form crack networks. In order to decrease the TD density, the III-N LED industry conventionally performs the pre-patterning on the sapphire epitaxy substrate. The same method is also applied to the Si (111) substrate. It is to be emphasized that the feature size of this conventional patterning process pertains to the micron (μm) level. Recently, by adopting the nanometer (nm) level patterning process, the TD density of the GaN epitaxial layer can be further reduced. This is because the nano-scale epitaxy structure dimension is advantageous to the decrease of the strain energy accumulated by the mismatched lattices, thereby decreasing the possibility of generating defects.

SUMMARY OF THE INVENTION

The invention relates to the flexible nano-imprint, and more particularly to the flexible nano-imprint that can be applied to a heterogeneous substrate (e.g., Si, GaAs, and the like) and its nondestructive native epitaxy substrate. The NIL technology is utilized in conjunction with dry-etching to perform the nano-scale patterning, and thus the non-planar substrate is utilized to control and deposit the epitaxy structure of III-N. Thus, the dislocation defect density is suppressed from extending upwards, and it is predicted that the low defect density can be obtained. In order to make the invention be easily understood and implemented, the embodiments will be described in the following.

DETAILED DESCRIPTION OF THE INVENTION

Figure 1:
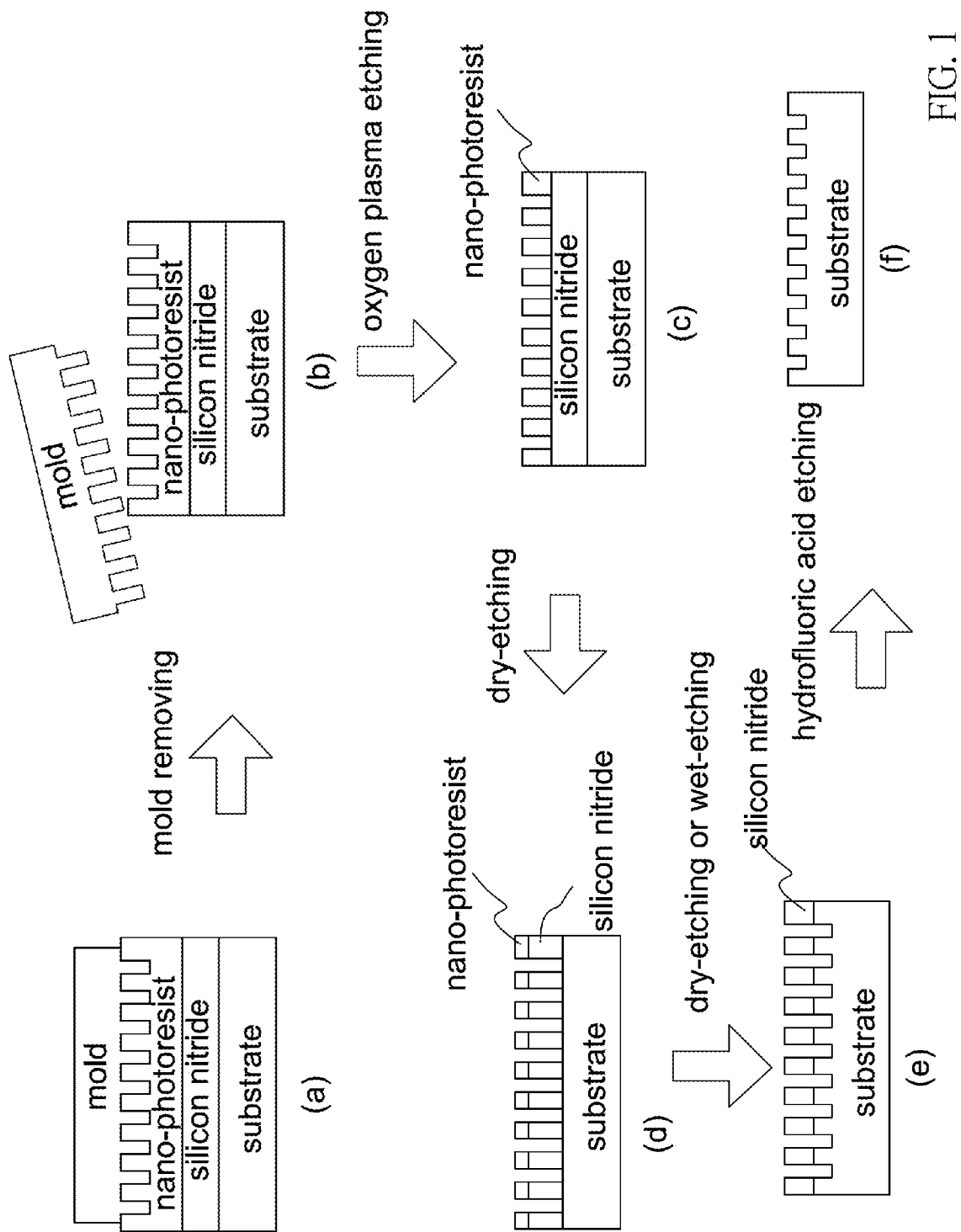
FIG. 1 shows that the flexible nano-imprint is used to perform transfer printing on an arbitrary substrate.
Figure 2:
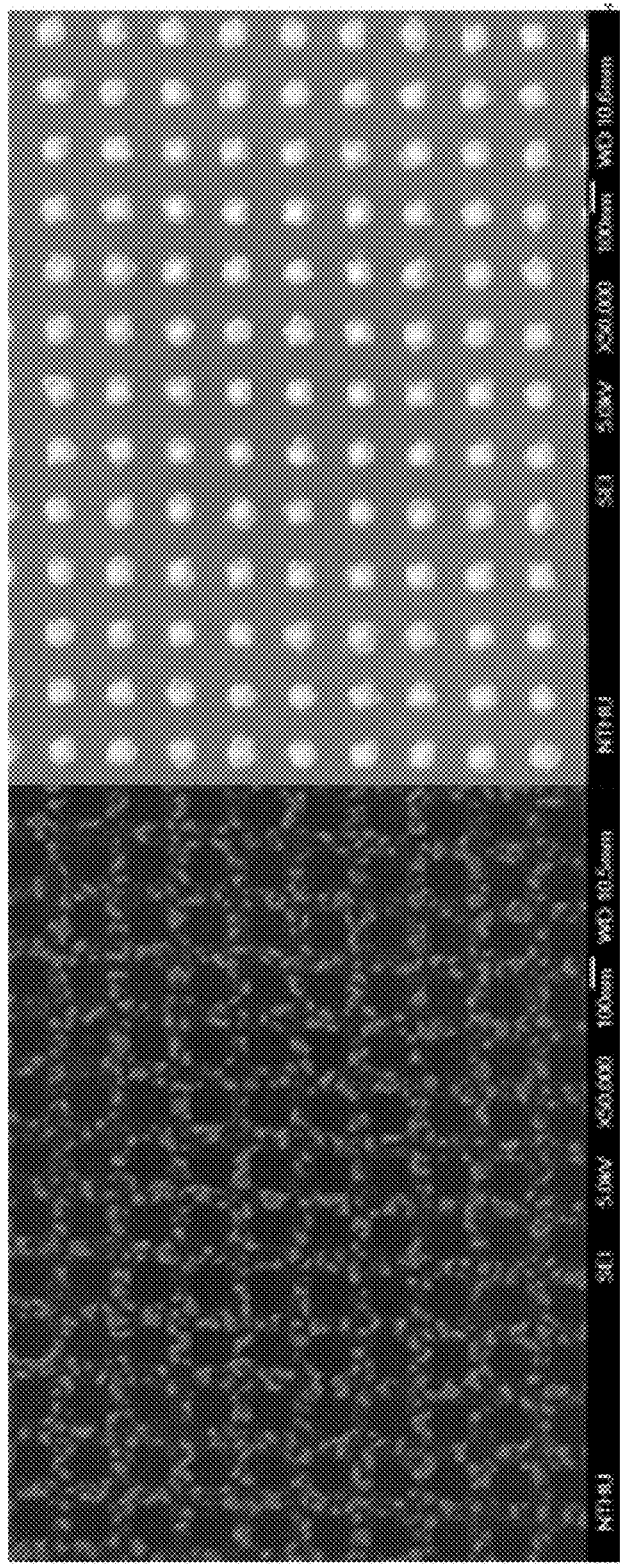
FIG. 2 shows nano-holes and nano-pillars after transfer printing.

A flexible nano-imprinting module is inversely printed on an arbitrary substrate. As shown in FIGS. 1(a) to 1(f), in the silicon master nano-process, silicon nitride (or silicon dioxide) is firstly deposited on the substrate (or epitaxy chip). Then, the UV-curable photoresist is spin coated. Next, the nano-mold is imprinted on the photoresist. The substrate (or epitaxy chip) and the nano-mold are exposed to the ultraviolet ray and the photoresist is cured, as shown in FIG. 1(a). After the nano-photoresist is cured, the nano-mold is removed, as shown in FIG. 1(b). At this time, the oxygen plasma ($O_2$ plasma) of the reactive ion etcher is utilized to etch the residual layer of the photoresist on the bottom of the pattern to the silicon nitride, as shown in FIG. 1(c), so that the pattern can be completely transfer printed to the nano-photoresist layer. Then, the trifluoromethane plasma is used to etch the silicon nitride, so that the substrate layer exposes the nano-pattern (FIG. 1(d)). Next, the dry/wet etching is used to transfer the pattern to the substrate (FIG. 1(e)). Finally, the hydrofluoric acid is used to remove the silicon nitride (FIG. 1(f)), so that the transfer printing of the nano-pattern is completed. The flexible nano-imprint technology has three applications in the aspect of research. The first application is to manufacture quantum structure lattices on the epitaxy chip. The second application is to use the flexible nano-imprint technology to manufacture the periodically arranged nano-holes on the sapphire substrate, gallium nitride or silicon substrate (111) and to grow the low-defect gallium nitride epitaxy layer in conjunction with the molecule beam epitaxy. The third application is to utilize the flexible nano-imprint technology to manufacture nano-holes on the substrate coated with the titanium film, as shown in FIG. 2(a), and to grow the site-controlled quantum dots or nano-pillars in conjunction with the molecule beam epitaxy, as shown in FIG. 2(b).

Figures 3A, 3B:
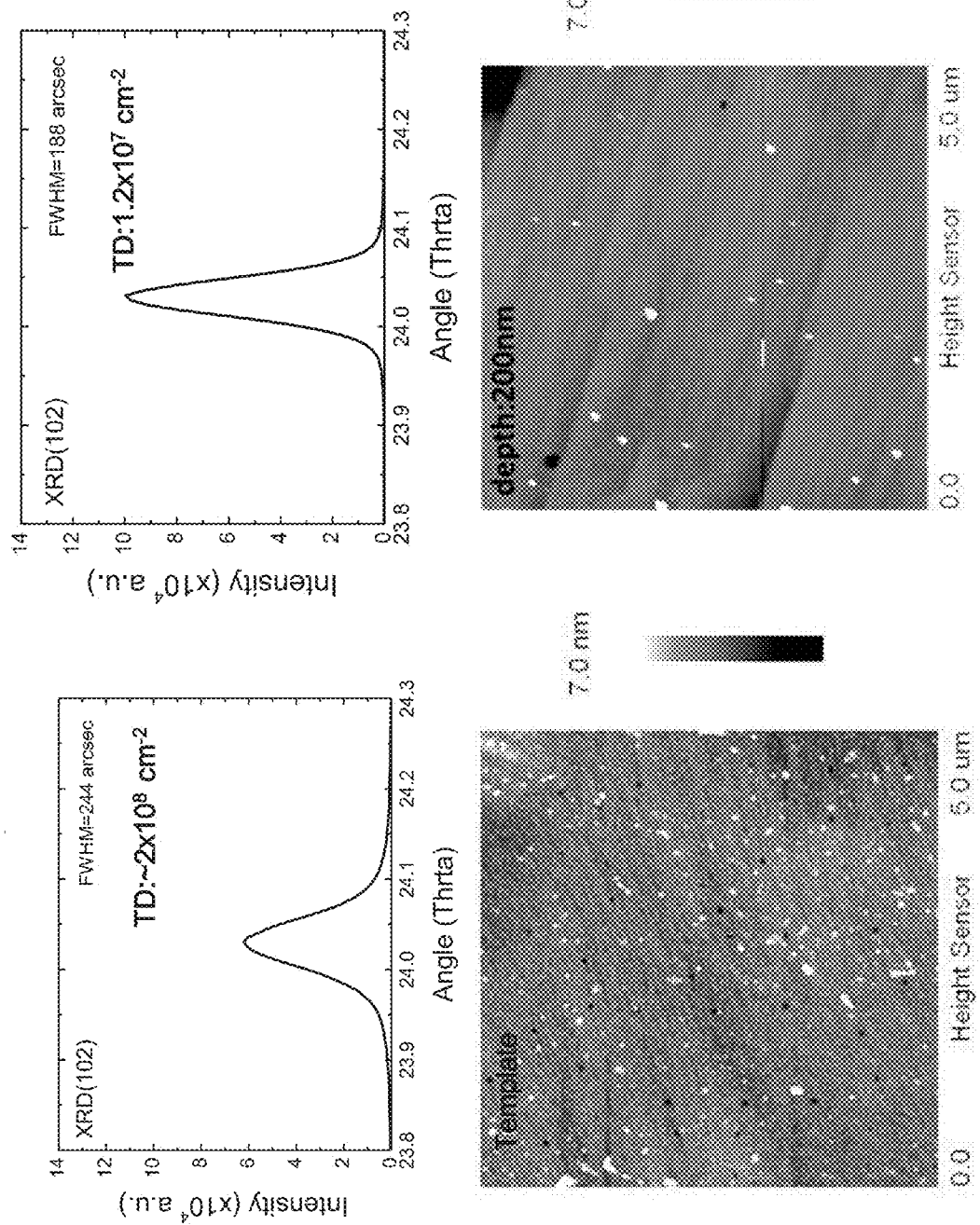
FIG. 3 shows quality measurement results of epitaxy growth gallium nitride after the transfer printing of the nano-holes.

Next, the flexible nano-imprint reversion on any substrate is successfully manufactured. Using the conditions of the molecule beam epitaxy (MBE), the substrate temperature of 780° C. and the III-V ratio of about 1:1 to grow the gallium nitride material, the photoluminescence instrument and the after-etched (KOH) AFM instrument may be used to observe the defect density. As shown in FIGS. 3(a) and 3(b), it is obtained that the nano-imprint technology applied to the low-defect epitaxy growth can decrease the low defect density from $10^8$ to $10^7$ cm$^{-2}$.

What is claimed is:

1. A gallium nitride epitaxial growth method, comprising the steps of:
   (1) providing a semiconductor laminated layer or a heterogeneous substrate;
   (2) forming a platform on the semiconductor laminated layer or the heterogeneous substrate to serve as a use of a flexible nano-imprint;
   (3) forming a nano-pillar or a nano-hole on the semiconductor laminated layer or the heterogeneous substrate; and
   (4) forming a heterogeneous epitaxy region on the semiconductor laminated layer or the heterogeneous substrate;
   wherein the step (3) of forming the nano-pillar or the nano-hole comprises:
   (i) using the flexible nano-imprint with a predetermined period on the semiconductor laminated layer or the heterogeneous substrate;
   (ii) performing a dry-etching process once on the semiconductor laminated layer or the heterogeneous substrate to transfer print a nano-pattern; and
   (iii) performing a peel off process so that the nano-pattern forms the nano-pillar or the nano-hole on the semiconductor laminated layer or the heterogeneous substrate.

2. The method according to claim 1, wherein the semiconductor laminated layer or the heterogeneous substrate comprises an upper block and a lower block, the lower block is the platform and abuts upon the semiconductor laminated layer or an upper surface of the heterogeneous substrate; and the upper block and the semiconductor laminated layer or the heterogeneous substrate are integrally formed and continuously connected to form a patterned layer of the nano-pillar or the nano-hole.

3. The method according to claim 2, wherein the upper block is formed by removing the semiconductor laminated layer or the heterogeneous substrate after the flexible nano-imprint is formed on a nano-photoresist layer; and the nano-photoresist layer is oxygen-plasma etched into the nano-pillar or nano-hole.

4. A gallium nitride epitaxial growth method, comprising:
   providing a substrate;
   forming a platform on the substrate to serve as a flexible nano-imprint;
   forming a nano-pillar or hole on the substrate; and
   forming a heterogeneous epitaxy region on the substrate;
   wherein the substrate comprises an upper block and a lower block; the lower block abuts upon an upper surface of the substrate, the lower block is the platform of the flexible nano-imprint; and the upper block is integrally formed and is continuously connected to the substrate to form a patterned layer of the nano-pillar or hole.

5. The method according to claim 4, wherein the substrate is a semiconductor laminated layer or a heterogeneous substrate.

6. The method according to claim 5, wherein the platform is formed by PECVD or thermal evaporation deposition to obtain a dielectric layer and an oxide layer, then forming the flexible nano-imprint on a nano-photoresist layer, and then using an oxygen plasma to etch the nano-photoresist layer into the nano-pillar or hole.

7. The method according to claim 6, wherein the upper block is formed by removing the dielectric layer or the oxide layer, and then dry-etching to remove the dielectric layer or the nano-pillar or hole of the oxide layer.

8. The method according to claim 7, wherein the upper block is to transfer print the nano-pillar or hole on the substrate after dry/wet etching to remove a portion of the substrate.

9. A gallium nitride epitaxial growth method, comprising:
   providing a semiconductor laminated layer or a heterogeneous substrate;
   the semiconductor laminated layer or heterogeneous substrate constitute an interface contacting a gallium nitride material;
   imprinting a flexible nanometer platform on the semiconductor laminated layer or the heterogeneous substrate; and
   transfer printing a nano-pillar or hole, and using molecule beam epitaxy (MBE) to grow the nano-pillar or hole, formed by transfer printing the gallium nitride material, on the semiconductor laminated layer or the heterogeneous substrate.

10. The method according to claim 9, wherein a dry/wet etching process is utilized to remove a portion of the semiconductor laminated layer or the heterogeneous substrate to obtain a gallium nitride layer with a depth of about 200 nm on the semiconductor laminated layer or the heterogeneous substrate.

* * * * *